United States Patent
Zheng et al.

(10) Patent No.: US 7,893,746 B1
(45) Date of Patent: Feb. 22, 2011

(54) HIGH SPEED INTRA-PAIR DE-SKEW CIRCUIT

(75) Inventors: Yuxiang Zheng, Richardson, TX (US); Hao Liu, Dallas, TX (US); Yanli Fan, Allen, TX (US); Mark W. Morgan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/578,895

(22) Filed: Oct. 14, 2009

(51) Int. Cl.
*H03H 11/26* (2006.01)
(52) U.S. Cl. ............... 327/263; 327/261; 327/558
(58) Field of Classification Search ......... 327/261–263, 327/270, 276, 551–558
See application file for complete search history.

(56) References Cited

U.S. PATENT DOCUMENTS

| | | | |
|---|---|---|---|
| 4,210,882 A | 7/1980 | Roza et al. | |
| 5,696,951 A * | 12/1997 | Miller | 713/503 |
| 7,085,337 B2 | 8/2006 | Dyer et al. | |
| 7,148,726 B2 * | 12/2006 | Oka et al. | 326/86 |
| 7,493,509 B2 | 2/2009 | Fung et al. | |
| 2007/0164802 A1 | 7/2007 | Rea et al. | |

FOREIGN PATENT DOCUMENTS

WO WO2004039023 5/2004

* cited by examiner

*Primary Examiner*—Dinh T. Le
(74) *Attorney, Agent, or Firm*—John J. Patti; Wade J. Brady, III; Frederick J. Telecky, Jr.

(57) ABSTRACT

For differential signal transmission (especially in high speed applications), intra-pair skew between paths carrying complementary portions of a differential signal can significantly affect performance. Conventional de-skew circuits employ simple filters (i.e., low-pass filters) to operate as delay elements to account for skew; however, these filters can distort the differential signal, which can also adverse affect performance. Here, an all-pass, adjustable delay element and de-skew circuit are provided to allow for compensation of skew without degrading the differential signal as conventional circuit do and, thus, having better performance characteristics.

16 Claims, 4 Drawing Sheets

HIGH SPEED INTRA-PAIR DE-SKEW CIRCUIT

TECHNICAL FIELD

The invention relates generally to differential signal transmission and, more particularly, to de-skewing differential signals.

BACKGROUND

In many applications, differential signals are transmitted through different paths (i.e., cables), which have different characteristics (i.e., lengths). These differences in signal paths can create skew (known as intra-pair skew) between the complementary portions of the differential signal, which can adversely affect performance (especially in high speed applications). Conventionally, analog de-skewing circuits generally employ filters as delay elements (such as the low-pass filter 100 of FIG. 1, which uses resistor R1 and capacitor C2). While such filters do delay of the portions of the differential signal, these filters can have significant frequency attenuation which adversely affects the rise and fall times of the portions of the differential signal, as can be seen in FIG. 2. Thus, there is a need for a delay element and de-skew circuit with better performance characteristics.

Some other conventional circuits are: U.S. Pat. No. 7,493,509; U.S. Pat. No. 4,210,882; U.S. Pat. No. 7,085,337; U.S. Patent Pre-Grant Publ. No. 2007/0164802; and PCT Publ. No. WO2004/039023.

SUMMARY

A preferred embodiment of the present invention, accordingly, provides an apparatus The apparatus comprises a first amplifier having a first gain, wherein the first amplifier receives an input signal; a second amplifier having a second gain, wherein the second amplifier receives the input signal; a resistor that is coupled to the second amplifier; a variable capacitor that is coupled to the second amplifier; and a third amplifier having a third gain, wherein the third amplifier is coupled to the resistor, the variable capacitor, the second amplifier, and the first amplifier, and wherein the product of the second gain, the resistance of the resistor, and the third gain is approximately equal to twice the first gain, and wherein propagation delay of the input signal through the apparatus is proportional to the capacitance of the variable capacitor.

In accordance with a preferred embodiment of the present invention, the resistor further comprises a first resistor and the first amplifier further comprises: a first bipolar transistor that receives the input signal at its base; a second resistor that is coupled to the emitter of the first bipolar transistor; a first current source that is coupled to the emitter of the first bipolar transistor; a second bipolar transistor that receives a bias voltage at its base and that is coupled to the second resistor at its emitter; and a second current source that is coupled to the emitter of the second bipolar transistor.

In accordance with a preferred embodiment of the present invention, the first and second bipolar transistors are NPN transistors.

In accordance with a preferred embodiment of the present invention, the second and third amplifiers further comprise: a third bipolar transistor that receives the input signal at its base; a third resistor that is coupled to the third bipolar transistor at its emitter, wherein the resistance of the second resistor is about twice of the resistance of the third resistor; a third current source that is coupled to the emitter of the third bipolar transistor; and a fourth bipolar transistor that receives the bias voltage at its base, that is coupled to the third resistor and the variable capacitor at its emitter, and that is coupled to the collector of the first transistor at its collector.

In accordance with a preferred embodiment of the present invention, the third and fourth transistors are NPN transistors.

In accordance with a preferred embodiment of the present invention, the variable capacitor is a varactor.

In accordance with a preferred embodiment of the present invention, an apparatus is provided. The apparatus comprises a skew detector that is coupled to a first path carrying a first portion of an input signal and a second path carrying a second portion of the input signal, wherein the skew detector measures the skew between the first and second portions of the input signal; a charge pump that is coupled to the skew detector; a first adjustable all-pass delay element that is located in the first path; and a second adjustable all-pass delay element that is located in the second path, wherein each of the first and second adjustable delay elements includes: a first amplifier having a first gain, wherein the first amplifier receives at least one of the first and second portions of the input signal; a second amplifier having a second gain, wherein the second amplifier receives at least one of the first and second portions of the input signal; a resistor that is coupled to the second amplifier; a variable capacitor that is coupled to the second amplifier and to the charge pump; and a third amplifier having a third gain, wherein the third amplifier is coupled to the resistor, the variable capacitor, the second amplifier, and the first amplifier, and wherein the product of the second gain, the resistance of the resistor, and the third gain is approximately equal to twice the first gain and wherein propagation delay of at least one of the first and second portions of the input signal through the apparatus is proportional to the capacitance of the variable capacitor.

In accordance with a preferred embodiment of the present invention, the first adjustable all-pass delay element further comprises a plurality of first adjustable all-pass delay element coupled in series with one another, and wherein the second adjustable all-pass delay element further comprises a plurality of second adjustable all-pass delay element coupled in series with one another.

In accordance with a preferred embodiment of the present invention, the apparatus further comprises a buffer that is coupled each of the first and second paths.

In accordance with a preferred embodiment of the present invention, an apparatus is provided. The apparatus comprises a skew detector that is coupled to a first path carrying a positive portion of a differential input signal and a second path carrying a negative portion of the differential input signal, wherein the skew detector measures the skew between the positive and negative portions of the differential input signal; a charge pump that is coupled to the skew detector; a plurality of first adjustable all-pass delay elements that are located in the first path, wherein the plurality of first adjustable all-pass delay elements are coupled in series with one another; and a plurality of second adjustable all-pass delay elements that are located in the second path, wherein the plurality of second adjustable all-pass delay elements are coupled in series with one another, and wherein each of the first and second adjustable delay elements includes: a voltage rail; a first resistor having a first resistance that is coupled to the voltage rail; a second resistor having the first resistance that is coupled to the voltage rail; a third resistor having the first resistance that is coupled to the voltage rail; a first NPN transistor that is coupled to the first resistor at its collector and that receives at least one of the positive portion of the differential input signal and the negative portion of the differential input signal at its base; a first current source that is coupled to the emitter of the first NPN transistor; a fourth resistor having a second resistance that is coupled to the emitter of the first NPN transistor, wherein the first resistance is about twice of the second resistance; a second NPN transistor that is coupled to the second resistor at its collector at its base, that is coupled to the fourth resistor at its emitter, and that receives a bias voltage at its base; a second current source that is coupled to the emitter of the second NPN transistor; a varactor that is coupled between the charge pump and the emitter of the second NPN transistor; a third NPN transistor that is coupled to the second resistor at its collector and that receives at least one of the positive portion of the differential input signal and the negative portion of the differential input signal at its base; a third current source that is coupled to the emitter of the third NPN transistor; a fifth resistor having the first resistance that is coupled to the emitter of the third NPN transistor; a fourth NPN transistor that is coupled to the third resistor at its collector, that is coupled to the fifth resistor at its emitter, and that receives the bias voltage at its base; and a fourth current source that is coupled to the emitter of the fourth NPN transistor.

In accordance with a preferred embodiment of the present invention, the apparatus further comprises a buffer that is coupled each of the first and second paths.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
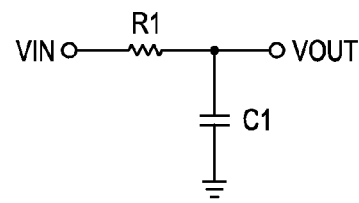
FIG. 1 is an example of a filter that is used as a delay circuit in conventional de-skew circuits.
Figure 2:
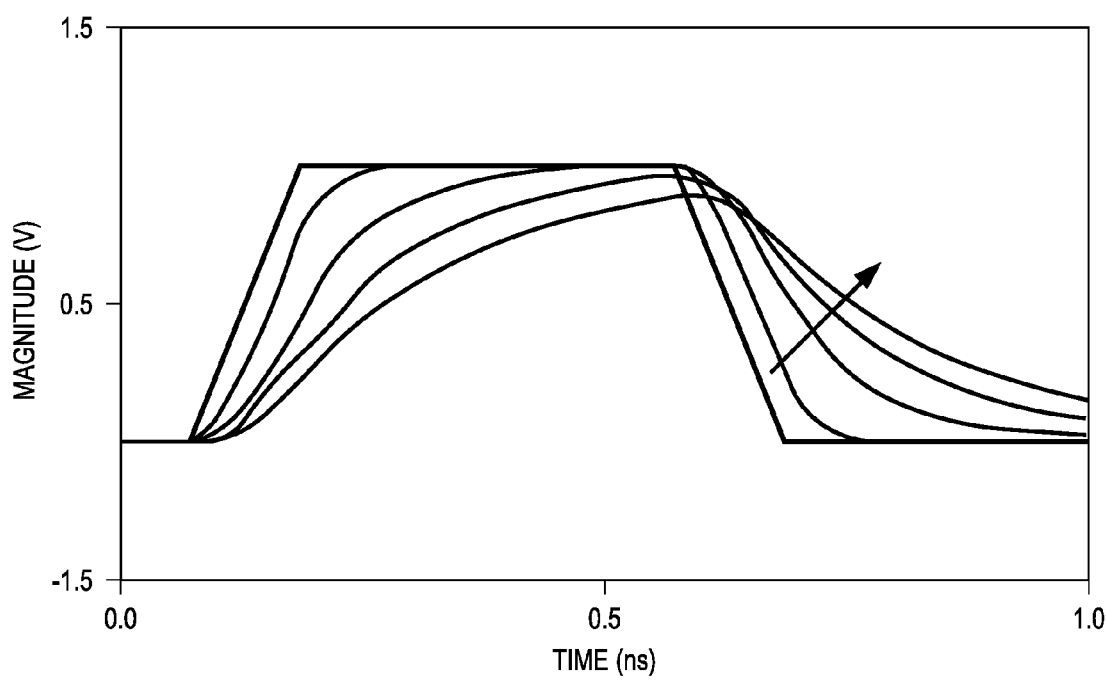
FIG. 2 is a graph depicting the operation of a conventional de-skew circuit having frequency attenuation.

Refer now to the drawings wherein depicted elements are, for the sake of clarity, not necessarily shown to scale and wherein like or similar elements are designated by the same reference numeral through the several views.

Figure 3:
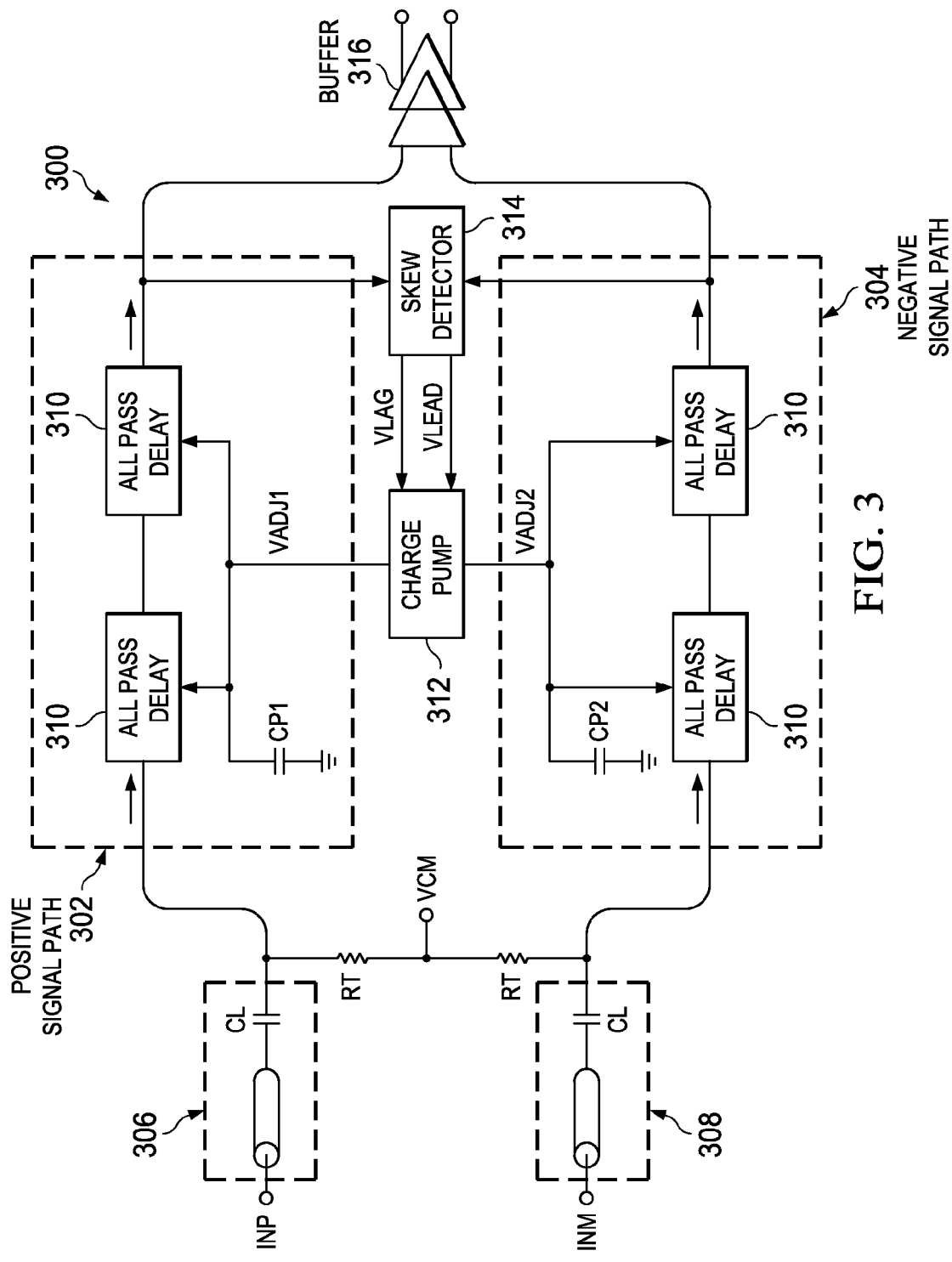
FIG. 3 is a block diagram of an example of a de-skew circuit in accordance with a preferred embodiment of the present invention.

Referring to FIG. 3 of the drawings, reference numeral 300 generally designates a de-skew circuit in accordance with a preferred embodiment of the present invention. Circuit 300 generally includes a positive signal path 302 for carrying the positive portion INP of a differential input signal and a negative signal path 304 for carrying the negative portion INM of a differential input signal. Each of the portions INP and INM are carried to the circuit 300 by transmission mediums 306 and 308, respectively, which are each generally comprised of a cable having an AC coupling capacitor CL. Each of transmission mediums 306 and 308 are also terminated by resistors RT (which typically have a resistance of about 50Ω) to a node that receives a common mode voltage VCM to generally eliminate signal reflections. Additionally, the output of each of paths 302 and 304 is provided to buffer 316.

Once the portions INP and INM are received, the circuit 300 is able to measure and compensate for the skew between the portions INP and INM. To accomplish this, a skew detector 314 is coupled to each of paths 302 and 302 so as to measure the skew. Based on these measurements, the skew detector 314 can provide a lag voltage VLAG and a lead voltage VLEAD to the charge pump 312, which indicates the relative skew for the portions INM and INP. The charge pump 312 can then provide the appropriate adjustment voltage VADJ1 and VAJD2 to the adjustable all-pass delay elements 310 of paths 302 and 304. Preferably, the charge pump 312 provides an adjustment voltage VADJ1 or VAJD2 to the path 302 or 304 having the "leading" signal so as to increase the delay for the "leading" signal to compensate for skew.

Figure 4:
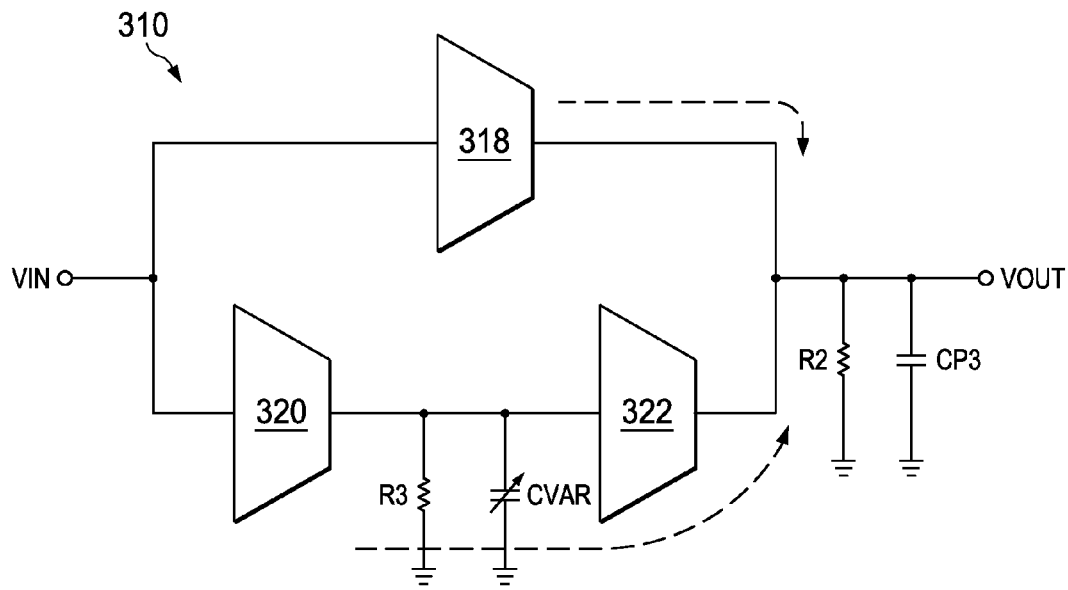
FIG. 4 is a block diagram of an example of an adjustable all-pass delay element from the de-skew circuit of FIG. 3.

Turning now to FIG. 4 of the drawings, a block diagram of an example of the adjustable all-pass delay elements 310 can be seen. Element 310 generally comprises amplifiers 318, 320, and 322 (which are generally transconductance amplifiers), resistors R2 and R3, parasitic capacitor CP3 (which are shown in FIG. 3 as capacitors CP1 and CP2), and variable capacitor CVAR, which are all arranged so that the element 310 has an overall unity gain or gain of about 1. As can be seen, the amplifiers 318, 320, and 322 (having gains g1, g2 and g3, respectively) are divided into two paths. The upper path is the "fast path" (which includes amplifier 318), and the lower path is the "slow path" (which includes amplifiers 322 and 320, resistor R3, and variable capacitor CVAR). In this configuration, the overall gain of the "slow path" (resistance of resistor R3 times the gains of amplifiers 320 and 322) is twice or double the gain of the "fast path" (gain of amplifier 318), with the sign of the gains of the "fast path" and "slow path" being ignored. Preferably, the gain of the "fast path" is −1 and the gain of the "slow path" is 2. Additionally, the overall frequency response H(ω) of element 310 is:

$$H(\omega) = \frac{g1 \cdot R2}{1 + i\omega \cdot R2 \cdot CP3} \cdot \frac{1 - i\omega \cdot R3 \cdot CVAR}{1 + i\omega \cdot R3 \cdot CVAR} \quad (1)$$

where the first and second portions of the expression correspond to the low-pass frequency response and the all pass response, respectively. Clearly, then, it is desirable to reduce the product of resistor R2 and parasitic capacitor CP3 (R2·CP3) to increase the bandwidth of element 310 and reduce distortion of the input signal VIN.

To change the characteristics of element 310, so as to obtain a propagation delay, the variable capacitor CVAR is adjusted. Typically, this is accomplished by application of an adjustment voltage (such as voltages VADJ1 and VADJ2) when the variable capacitor CVAR is implemented as a varactor, for example. When this value of the variable capacitor CVAR is changed, the frequency magnitude and bandwidth (which is determined by the first portion of the expression of equation (1)) remains the same, while the group delay D(ω) of element 310 changes. The group delay D(ω) can be represented as follows:

$$D(\omega) = \frac{R2 \cdot CP3}{1+(\omega \cdot R2 \cdot CP3)^2} \cdot \frac{2 \cdot R3 \cdot CVAR}{1+(\omega \cdot R3 \cdot CVAR)^2} \quad (2)$$

Thus, element 310 does not degrade signal integrity and provides a delay. Additionally, there is a rough proportionality between the value of the variable capacitor CVAR and the propagation delay of the input signal VIN through element 310.

Figure 5:
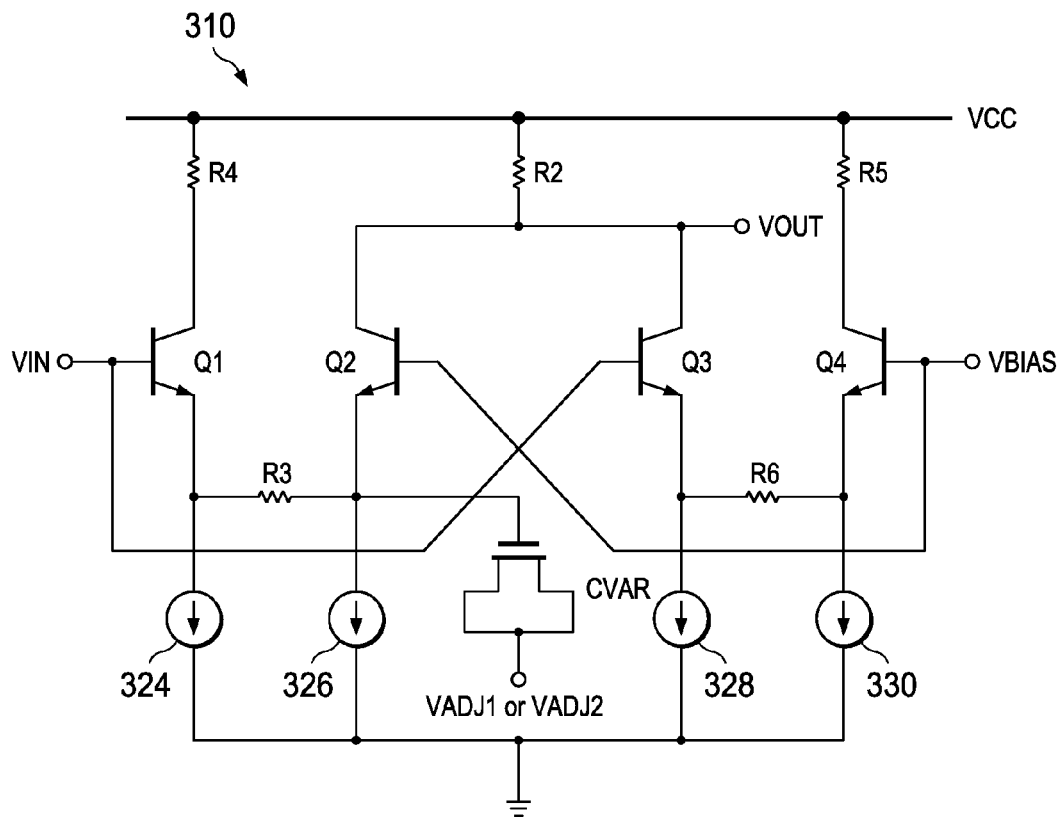
FIG. 5 is an example of a circuit diagram of the adjustable all-pass delay element of FIG. 4.

Turning to FIG. 5, an example of a circuit diagram for the element 310 of FIGS. 3 and 4 can be seen. Here, resistors R2 and R3, NPN transistors Q3 and Q4, current sources 328 and 330, and resistor R6 operate as the "fast path" of FIG. 3, while resistors R2, R4, and R3, NPN transistors Q1 and Q2, current sources 324 and 326, and variable capacitor CVAR (which is implemented as a varactor) operate as the "slow path" of FIG. 3. Each of the resistors R2, R4, R5, and R6 have approximately the same resistance (about 1 kΩ) while resistor R3 has approximately twice the resistance (about 500Ω) of each of resistors R2, R4, R5, and R6 to generally ensure that element 310 has an overall unity gain. Additionally, variable capacitor CVAR generally has a value that can be adjusted between about 0 fF and about 200 fF (for example) so that when the value of capacitor CVAR is small (about 0 fF, for example), the delay is about 50 ps, and when the value of variable capacitor CVAR is large (about 200 fF, for example), the delay is on the order of a few hundred of picoseconds. Other values for variable capacitor CVAR and delay lengths may also be employed. Alternatively, a configuration employing PNP transistors can be also used.

Figure 6:
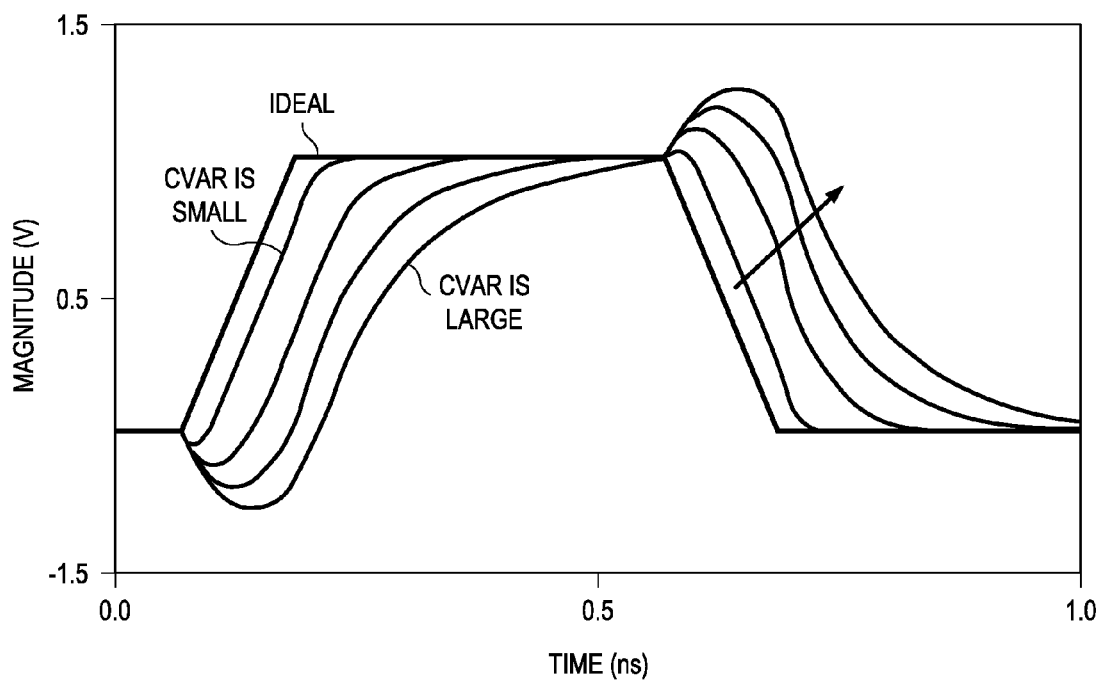
FIG. 6 is a graph depicting the operation of the de-skew circuit of FIG. 3.

Now turning to FIG. 6, the operation of element 310 can be seen. When the input signal VIN propagates through the "fast path", transistors Q3 and Q4 and resistors R2, R5, and R6 (or amplifier 318) operate to invert the input signal (applying a gain of −1, for example) so that the output signal of the "fast path" is substantially negative. Additionally, when the input signal propagates through the "slow path", transistors Q1 through Q3, resistors R2 through R4, and variable capacitor CVAR (or amplifiers 320 and 322, resistors R2 and R3, and variable capacitor CVAR) apply a positive gain (a gain of 2, for example) to the input signal VIN so that (when combined with the output from the "fast path") it compensates for the output of the "fast path" and generally ensures that the amplitude and rise time of the output signal VOUT is substantially the same as the input signal VIN. The time for when the signals from the "fast path" and "slow path" are combined is varied by the value of the variable capacitor CVAR. As can be seen in FIG. 6, when the value of variable capacitor CVAR is small (on the order of 0 fF, for example), the outputs from each of the "fast path" and "slow path" are combined almost at the same time, whereas when the value of the variable capacitor CVAR is large (on the order of 200 fF, for example), there is a delay on the order of a few hundred picosecond. Therefore, the element 310 provides a compact all-pass delay element with better performance characteristics than other conventional topologies.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first amplifier having a first gain, wherein the first amplifier receives an input signal;
   a second amplifier having a second gain, wherein the second amplifier receives the input signal;
   a resistor that is coupled to the second amplifier;
   a variable capacitor that is coupled to the second amplifier; and
   a third amplifier having a third gain, wherein the third amplifier is coupled to the resistor, the variable capacitor, the second amplifier, and the first amplifier, and wherein a product of the second gain, the resistance of the resistor, and the third gain is approximately equal to twice the first gain, and wherein propagation delay of the input signal through the apparatus is proportional to the capacitance of the variable capacitor.

2. The apparatus of claim 1, wherein the resistor further comprises a first resistor and the first amplifier further comprises:
   a first bipolar transistor that receives the input signal at its base;
   a second resistor that is coupled to the emitter of the first bipolar transistor;
   a first current source that is coupled to the emitter of the first bipolar transistor;
   a second bipolar transistor that receives a bias voltage at its base and that is coupled to the second resistor at its emitter; and
   a second current source that is coupled to the emitter of the second bipolar transistor.

3. The apparatus of claim 2, wherein the first and second bipolar transistors are NPN transistors.

4. The apparatus of claim 2, wherein the second and third amplifiers further comprise:
   a third bipolar transistor that receives the input signal at its base;
   a third resistor that is coupled to the third bipolar transistor at its emitter, wherein the resistance of the second resistor is about twice of the resistance of the third resistor;
   a third current source that is coupled to the emitter of the third bipolar transistor; and
   a fourth bipolar transistor that receives the bias voltage at its base, that is coupled to the third resistor and the variable capacitor at its emitter, and that is coupled to the collector of the first transistor at its collector.

5. The apparatus of claim 4, wherein the third and fourth transistors are NPN transistors.

6. The apparatus of claim 4, wherein the variable capacitor is a varactor.

7. An apparatus comprising:
   a skew detector that is coupled to a first path carrying a first portion of an input signal and a second path carrying a second portion of the input signal, wherein the skew detector measures the skew between the first and second portions of the input signal;
   a charge pump that is coupled to the skew detector;
   a first adjustable all-pass delay element that is located in the first path; and a second adjustable all-pass delay element that is located in the second path, wherein each of the first and second adjustable delay elements includes:
  a first amplifier having a first gain, wherein the first amplifier receives at least one of the first and second portions of the input signal;
  a second amplifier having a second gain, wherein the second amplifier receives at least one of the first and second portions of the input signal;
  a resistor that is coupled to the second amplifier;
  a variable capacitor that is coupled to the second amplifier and to the charge pump; and
  a third amplifier having a third gain, wherein the third amplifier is coupled to the resistor, the variable capacitor, the second amplifier, and the first amplifier, and wherein a product of the second gain, the resistance of the resistor, and the third gain is approximately equal to twice the first gain and wherein propagation delay of at least one of the first and second portions of the input signal through the apparatus is proportional to the capacitance of the variable capacitor.

8. The apparatus of claim 7, wherein the resistor further comprises a first resistor and the first amplifier further comprises:
  a first bipolar transistor that receives at least one of the first and second portions of the input signal at its base;
  a second resistor that is coupled to the emitter of the first bipolar transistor;
  a first current source that is coupled to the emitter of the first bipolar transistor;
  a second bipolar transistor that receives a bias voltage at its base and that is coupled to the second resistor at its emitter; and
  a second current source that is coupled to the emitter of the second bipolar transistor.

9. The apparatus of claim 8, wherein the first and second bipolar transistors are NPN transistors.

10. The apparatus of claim 8, wherein the second and third amplifiers further comprise:
  a third bipolar transistor that receives at least one of the first and second portions of the input signal at its base;
  a third resistor that is coupled to the third bipolar transistor at its emitter, wherein the resistance of the second resistor is about twice of the resistance of the third resistor;
  a third current source that is coupled to the emitter of the third bipolar transistor; and
  a fourth bipolar transistor that receives the bias voltage at its base, that is coupled to the third resistor and the variable capacitor at its emitter, and that is coupled to the collector of the first transistor at its collector.

11. The apparatus of claim 10, wherein the third and fourth transistors are NPN transistors.

12. The apparatus of claim 10, wherein the variable capacitor is a varactor.

13. The apparatus of claim 8, wherein the first adjustable all-pass delay element further comprises a plurality of first adjustable all-pass delay element coupled in series with one another, and wherein the second adjustable all-pass delay element further comprises a plurality of second adjustable all-pass delay element coupled in series with one another.

14. The apparatus of claim 8, wherein the apparatus further comprises a buffer that is coupled each of the first and second paths.

15. An apparatus comprising:
  a skew detector that is coupled to a first path carrying a positive portion of a differential input signal and a second path carrying a negative portion of the differential input signal, wherein the skew detector measures the skew between the positive and negative portions of the differential input signal;
  a charge pump that is coupled to the skew detector;
  a plurality of first adjustable all-pass delay elements that are located in the first path, wherein the plurality of first adjustable all-pass delay elements are coupled in series with one another; and
  a plurality of second adjustable all-pass delay elements that are located in the second path, wherein the plurality of second adjustable all-pass delay elements are coupled in series with one another, and wherein each of the first and second adjustable delay elements includes:
    a voltage rail;
    a first resistor having a first resistance that is coupled to the voltage rail;
    a second resistor having the first resistance that is coupled to the voltage rail;
    a third resistor having the first resistance that is coupled to the voltage rail;
    a first NPN transistor that is coupled to the first resistor at its collector and that receives at least one of the positive portion of the differential input signal and the negative portion of the differential input signal at its base;
    a first current source that is coupled to the emitter of the first NPN transistor;
    a fourth resistor having a second resistance that is coupled to the emitter of the first NPN transistor, wherein the first resistance is about twice of the second resistance;
    a second NPN transistor that is coupled to the second resistor at its collector at its base, that is coupled to the fourth resistor at its emitter, and that receives a bias voltage at its base;
    a second current source that is coupled to the emitter of the second NPN transistor;
    a varactor that is coupled between the charge pump and the emitter of the second NPN transistor;
    a third NPN transistor that is coupled to the second resistor at its collector and that receives at least one of the positive portion of the differential input signal and the negative portion of the differential input signal at its base;
    a third current source that is coupled to the emitter of the third NPN transistor;
    a fifth resistor having the first resistance that is coupled to the emitter of the third NPN transistor;
    a fourth NPN transistor that is coupled to the third resistor at its collector, that is coupled to the fifth resistor at its emitter, and that receives the bias voltage at its base; and
    a fourth current source that is coupled to the emitter of the fourth NPN transistor.

16. The apparatus of claim 15, wherein the apparatus further comprises a buffer that is coupled each of the first and second paths.

* * * * *